(12) United States Patent
Hiller et al.

(10) Patent No.: US 11,380,830 B2
(45) Date of Patent: Jul. 5, 2022

(54) THERMAL ENERGY APPARATUS AND RELATED METHODS

(71) Applicant: The Boeing Company, Chicago, IL (US)

(72) Inventors: Nathan D. Hiller, Irvine, CA (US); Paul Alan Beazley, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/849,654

(22) Filed: Dec. 20, 2017

(65) Prior Publication Data

US 2019/0189882 A1  Jun. 20, 2019

(51) Int. Cl.

| | |
|---|---|
| *H01L 35/04* | (2006.01) |
| *H01L 35/30* | (2006.01) |
| *H01L 49/02* | (2006.01) |
| *C01C 1/02* | (2006.01) |
| *C01C 1/04* | (2006.01) |

(52) U.S. Cl.
CPC .............. *H01L 35/04* (2013.01); *C01C 1/022* (2013.01); *C01C 1/04* (2013.01); *H01L 28/40* (2013.01); *H01L 35/30* (2013.01)

(58) Field of Classification Search
CPC ............................ H01I 28/40; H01I 35/04–30
See application file for complete search history.

(56) References Cited

U.S. PATENT DOCUMENTS

| | | |
|---|---|---|
| 4,734,139 A | 3/1988 | Shakun et al. |
| 5,156,004 A | 10/1992 | Wu et al. |
| 6,747,572 B2 | 6/2004 | Bocko et al. |
| 6,787,691 B2 | 9/2004 | Fleurial et al. |
| 6,791,183 B2 | 9/2004 | Kanelis |
| 6,914,343 B2 | 7/2005 | Hiller et al. |
| 7,405,013 B2* | 7/2008 | Yang ..................... C01B 3/0005 420/900 |
| 2002/0088250 A1* | 7/2002 | Kotliar ................. A62C 3/0221 62/640 |
| 2004/0142733 A1* | 7/2004 | Parise ................... B01F 5/0614 455/572 |
| 2008/0098972 A1* | 5/2008 | Elwart ................... B60K 13/04 123/142.5 E |
| 2008/0257395 A1* | 10/2008 | Jovanovic ............. H01L 29/155 136/239 |

(Continued)

OTHER PUBLICATIONS

Elliott, Louis D., The Freezing Point Curve of the System Water-Ammonia, The Journal of Physical Chemistry, 1924, pp. 887-888, vol. 28(8).

(Continued)

*Primary Examiner* — Edward J. Schmiedel
(74) *Attorney, Agent, or Firm* — Kolisch Hartwell, P.C.

(57) ABSTRACT

An energy harvesting apparatus may include a thermoelectric device, a heat exchanger coupled to the thermoelectric device, a thermal capacitor container, and a thermal capacitor generation device. The thermal capacitor generation device may be configured to generate a thermal capacitor fluid, to be contained in the thermal capacitor container. An electrical energy storage device may be electrically connected to the thermoelectric device, to store electricity generated by the thermoelectric device.

24 Claims, 5 Drawing Sheets

(56) References Cited

U.S. PATENT DOCUMENTS

| | | | | |
|---|---|---|---|---|
| 2010/0101621 A1* | 4/2010 | Xu | ......................... | C09K 5/063 |
| | | | | 136/206 |
| 2011/0061295 A1* | 3/2011 | McAlister | ............... | C01B 3/042 |
| | | | | 47/59 R |
| 2012/0260962 A1* | 10/2012 | Caroff | ..................... | H01L 35/34 |
| | | | | 136/205 |

OTHER PUBLICATIONS

Croft, S.K. et al., Equation of State of Ammonia—Water Liquid: Derivation and Planetological Applications, Icarus, 1988, pp. 279-293, vol. 73.

Bennett, Gary L., "Safety Aspects of Thermoelectrics in Space", CRC Handbook of Thermoelectrics CRC Press, 1995, pp. 551-573.

Landis, Geoffrey A. et al. "Dust on Mars: Materials Adherence Experiment Results from Mars Pathfinder", IEEE, 1997, pp. 865-869.

"Customer Manual—Aqua Ammonia", Tanner Industries, 1998, pp. 1-9.

Furlong, Richard R. et al., "U.S. Space Missions Using Radioisotope Power Systems", Nuclear News, Apr. 1999, pp. 26-34.

Jenkins, P.P. et al., "Status of the Dust Accumulation and Removal Technology Experiment for the Mar. 2001 Surveyor Lander", 1999.

Phillips, Tony, "The Solar Wind at Mars", NASA, Jan. 30, 2001, pp. 1-6.

Landis, Geoffrey A. et al. "Dust Mitigation for Mars Solar Arrays", IEEE, 2002, pp. 812-815.

Lorenz, Ralph D. "Subsurface Ambient Thermoelectric Power for Moles and Penetrators", IEEE, Nov. 15, 2002, pp. 1-6.

Bennett, Gary L. et al., "Mission of Daring: The General-Purpose Heat Source Radioisotope Thermoelectric Generator", American Institute of Aeronautics and Astronautics, 2006, pp. 1-23.

Snyder, Jeffrey G., et al. "Complex Thermoelectric Materials", Nature Materials, Feb. 2008, pp. 105-114, vol. 7.

Coffey, Jerry, "Air on Mars," Universe Today, Jun. 5, 2008, pp. 1-3.

"Safety of Radioisotope Power Systems", National Aeronautics and Space Adiministration, May 2012, 2 pages.

Whalen, Scott A. et al. "Thermoelectric Energy Havesting From Diurnal Heat Flow in the Upper Soil Layer", Energy Conversion and Management, Jun. 15, 2012, pp. 397-402, vol. 64.

"What is Plutonium-238?", National Aeronautics and Space Administration, Oct. 2012, 2 pages.

Mersmann, Kathryn, "The Fact and Fiction of Martian Storms", NASA's Goddard Space Flight Center in Greenbelt, Sep. 18, 2015, 4 pages.

"Radioisotope Heater Units", National Aeronautics and Space Administration, May 26, 2016, 2 pages.

Lee, HoSung, "Thermoelectrics Design and Materials", John Wiley & Sons Ltd, 2017, pp. 1-432.

"Armstrong Limit", Wikipedia, Aug. 19, 2017, 4 pages.

"Mars Climate Database v5.2", The Web Interface, Oct. 23, 2017, 1 page.

Brown, Dwaye, "Mars Exploration Radioisotope Power and Heating for Mars Surface Exploration", National Aeronautics and Space Administration, Oct. 24, 2017.

"Mars Climate Database v5.3", The Web Interface, Dec. 19, 2017, 1 page.

* cited by examiner

THERMAL ENERGY APPARATUS AND RELATED METHODS

FIELD

This disclosure relates to systems and methods for storing thermal energy. More specifically, the disclosed embodiments relate to using a temperature gradient associated with a thermal capacitor.

INTRODUCTION

Harvesting energy from environmental sources such as sunlight and wind is a rapidly developing field of inquiry. Electrically powered technology is spreading to increasingly remote locations, and portable power sources that do not require a fuel supply are an important part of that infrastructure. For example, solar cell arrays are used to power equipment for use on Mars. However, solar cell arrays must be deployed precisely and are vulnerable to damage from abrasive sandstorms common on Mars or from simple blockage by electrostatically adhered dust.

Thermoelectric generators that convert thermal energy into electrical energy are one promising energy harvesting tool. In a typical generator, a circuit including n-doped and p-doped semiconductors is disposed across a thermal gradient. Heat moves across each semiconductor and redistributes the concentration of majority charge carriers toward the cooler side, creating an electromotive force according to the Seebeck effect and thus generating current in the circuit.

Often thermoelectric generators are used to recapture waste heat energy, from sources such as vehicle engines. In such applications, the thermal gradient has a constant direction. Fluctuating thermal gradients can also be used, as current can flow in either direction through the circuit of the generator. Further, use of a thermal capacitor allows energy to be harvested from an environment with fluctuating temperature by creating the needed gradient. Energy harvesting from environmental temperature cycles to provide power in remote locations is promising, but requires transportation of the thermal capacitor. Effective phase-change thermal capacitors such as water can be dense and heavy, and therefore difficult and/or costly to transport.

SUMMARY

The present disclosure provides systems, apparatus, and methods relating to energy harvesting. In some embodiments, an energy harvesting apparatus may include a thermoelectric device, a heat exchanger coupled to the thermoelectric device, a thermal capacitor container, and a thermal capacitor generation device. The thermal capacitor generation device may be configured to generate a thermal capacitor fluid, to be contained in the thermal capacitor container. An electrical energy storage device may be electrically connected to the thermoelectric device, to store electricity generated by the thermoelectric device. In some embodiments, the thermoelectric capacitor generation device may use ambient air to synthesize the thermal capacitor fluid. In some embodiments, the thermal capacitor fluid may be tuned to change phase at a selected intermediate temperature of a selected environment.

Features, functions, and advantages may be achieved independently in various embodiments of the present disclosure, or may be combined in yet other embodiments, further details of which can be seen with reference to the following description and drawings.

DESCRIPTION

Various aspects and examples of an energy harvesting apparatus having a thermal capacitor generation device, as well as related methods, are described below and illustrated in the associated drawings. Unless otherwise specified, an energy harvesting apparatus and/or its various components may, but are not required to, contain at least one of the structure, components, functionality, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

Overview

In general, an energy harvesting apparatus may include a thermoelectric device and a thermal capacitor generation device. The generation device may be configured to generate a thermal capacitor fluid. The fluid may be stored in a container, such that the fluid is in thermal communication with the thermoelectric device. The thermoelectric device may also be in thermal communication with an environment or ambient atmosphere surrounding the apparatus. Thermal communication between the thermoelectric device and the fluid or the atmosphere may be mediated by a passive heat exchanger or heat sink.

The energy harvesting apparatus may convert thermal energy from the ambient atmosphere into electrical energy.

The electrical energy may be stored in an energy storage device such as a battery that is included in the apparatus and/or may be used to power electrical devices. The energy harvesting apparatus may include sensors or other equipment requiring electrical power, may store energy for later use, may be connected to a power grid, and/or any effective combination thereof.

The thermal capacitor generation device may use the ambient atmosphere to synthesize the thermal capacitor fluid. Sources of one or more components of the thermal capacitor fluid may be included in the thermal capacitor generation device for use in synthesis. For example, an energy harvesting apparatus for use on Mars may include a reservoir of hydrogen. The generation device may combine the hydrogen with oxygen and nitrogen extracted from the Martian atmosphere to synthesize a thermal capacitor fluid comprising an aqueous ammonia solution.

One or more additional or secondary power sources may be included in the energy harvesting apparatus. On installation, the energy harvesting apparatus may generate limited power or no power while the thermal capacitor fluid is generated. The secondary power sources may provide power to the thermal capacitor generation device during this period. Some examples of secondary power sources include charged batteries, solar panels, and wind turbines.

The energy harvester apparatus may be located in any environment having a periodic ambient temperature fluctuation. In some examples, the energy harvester may be established on a remote planet, in a remote terrestrial location, and/or adjacent outdoor equipment requiring power. For instance, the energy harvester may be installed on a cell tower located in an undeveloped desert region, or may be used to power remote sensors. In some examples, one or more energy harvesters may be used to power equipment searching for signs of life in the Martian or other planetary atmosphere. In some examples, an energy harvester may be included in mobile equipment, such as a Martian rover.

The thermal capacitor fluid may be configured to have a liquid-solid phase change at an intermediate temperature of the ambient temperature fluctuation. The thermal capacitor may store thermal energy from the environment, and undergo a phase fluctuation and/or a temperature fluctuation correlated to the temperature fluctuation of the environment.

The thermal capacitor fluid may also be tunable, such that the phase change occurs at a selected temperature. The thermal capacitor may be tuned prior to operation of the energy harvester apparatus according to an expected range of the temperature fluctuation, or may be tuned during installation of the energy harvester according to one or more measurements of the temperature fluctuation. Alternatively or in addition, the thermal capacitor fluid may be tuned periodically or continuously according to projected changes in the ambient temperature fluctuation, measurements of environmental conditions, and/or operational efficiency of the energy harvester apparatus.

Examples, Components, and Alternatives

The following sections describe selected aspects of exemplary energy harvester apparatus as well as related systems and/or methods. The examples in these sections are intended for illustration and should not be interpreted as limiting the entire scope of the present disclosure. Each section may include one or more distinct embodiments or examples, and/or contextual or related information, function, and/or structure.

A. Illustrative Martian Energy Harvester

Figure 1:
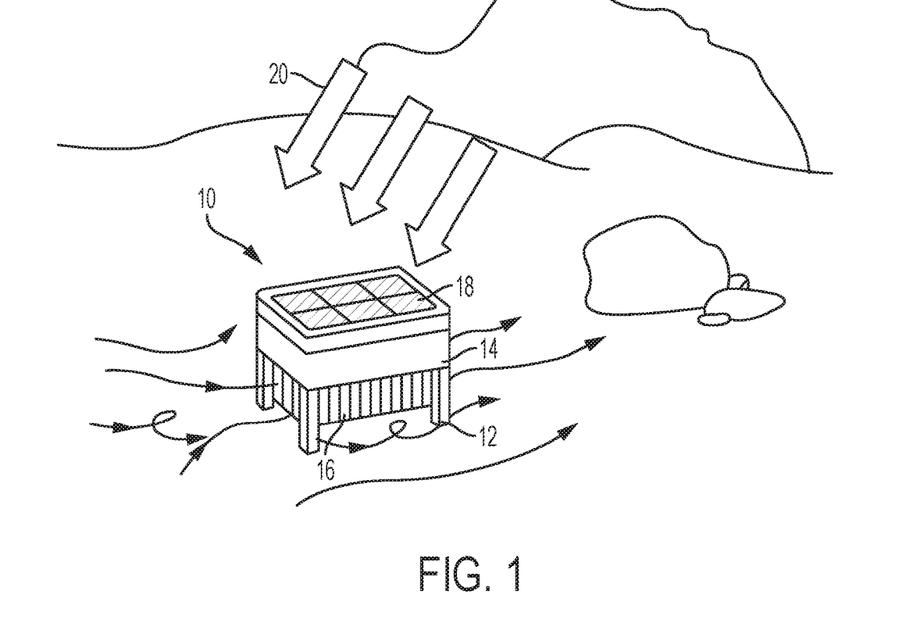
FIG. 1 is an isometric view of an illustrative energy harvester in accordance with aspects of the present disclosure, being used to harvest thermal and solar energy on Mars.

FIG. 1 shows an illustrative energy harvester 10 in operation on Mars. Energy harvester 10 is an example of an energy harvesting apparatus, as described above. The energy harvester includes support struts 12 configured to support an insulated main body 14 and a heat sink 16. In some examples, support struts 12 may include stabilizing features, height adjusting mechanisms, and/or connecting features. Energy harvester 10 may include any supports appropriate to the environment. Main body 14 and heat sink 16 may be mounted on support struts 12 as depicted, or in any configuration providing appropriate thermal interaction with the environment.

As shown in FIG. 1, heat sink 16 is elevated from the Martial soil surface. This placement may allow air circulation through and around the heat sink, in turn improving heat exchange between heat sink 16 and the ambient air. A solar panel 18 is disposed on top of main body 14. In this position, the panel may harvest solar energy 20 and shield main body 14 from heating by the sunlight.

Figure 2:
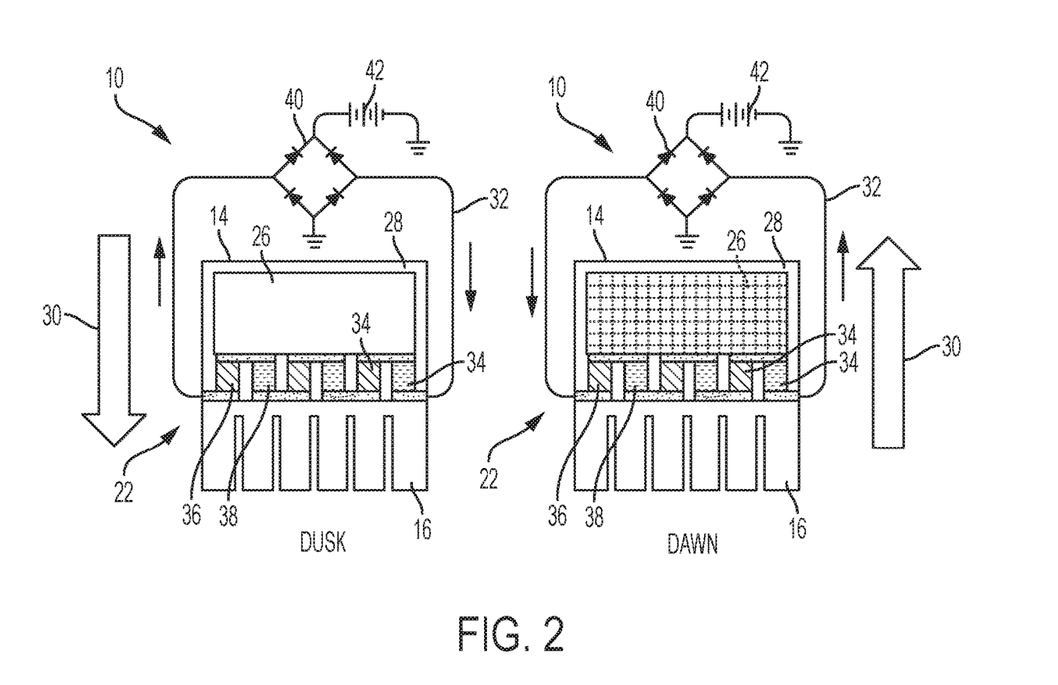
FIG. 2 is a schematic diagram of components of the energy harvester of FIG. 1 undergoing a temperature fluctuation.

FIG. 2 is a schematic diagram depicting components of energy harvester 10, including main body 14 and heat sink 16. Some components of the energy harvester have been omitted for simplicity. The main body includes a tank 24 to hold a thermal capacitor 26, and insulation 28, which may insulate the tank from the ambient air. Thermal capacitor 26 is configured to have a liquid-solid phase change at a median temperature, an average temperature, and/or an inflection point of the daily temperature fluctuation, such as the average temperature at dawn. The thermal capacitor may also be tunable, such that the liquid-solid phase change occurs at a higher temperature during the Martian summer season and at a lower temperature during the winter season.

Energy harvester 10 is shown in FIG. 2 at two different points in the ambient temperature fluctuation of the environment, close to when the ambient temperature reaches the phase-change temperature of thermal capacitor 26. In the present example, the fluctuation is part of the day-night cycle on Mars and the depicted points in the cycle correspond approximately to dawn and dusk.

On the left in FIG. 2, the energy harvester is shown at dusk. The ambient air is just colder than thermal capacitor 26 and the thermal capacitor is liquid. Heat 30 transfers from the thermal capacitor through a thermoelectric module 22 and to the environment via heat sink 16. During the following cold Martian night, some cumulative amount of heat is lost from thermal capacitor 26 to the environment, where the amount depends on thermal properties and spatial configuration of the energy harvester. Depending on the amount of heat lost and the initial temperature of thermal capacitor 26, the capacitor may decrease in temperature, undergo a phase change from liquid to solid while remaining at the phase-change temperature, and then further decrease in temperature.

In the present example, thermal capacitor 26 is configured to change phase gradually over the course of the night, such that the phase change is completed at about dawn and the temperature of the thermal capacitor remains approximately the same throughout. In some examples, only a portion of thermal capacitor 26 may undergo the phase-change, or the thermal capacitor may only undergo a change in temperature.

On the right in FIG. 2, energy Harvester 10 is shown at dawn. The ambient air is just warmer than thermal capacitor 26 and the thermal capacitor is solid. Heat 30 transfers from the environment via heat sink 16 through thermoelectric module 22 to the thermal capacitor. Over the course of the following hot day, some cumulative amount of heat is absorbed by thermal capacitor 26 from the environment, where the amount depends on thermal properties and spatial configuration of the energy harvester. Depending on the amount of heat absorbed and the initial temperature of thermal capacitor 26, the capacitor may increase in temperature, undergo a phase change from solid to liquid while remaining at the phase-change temperature, and then further increase in temperature.

In the present example, thermal capacitor 26 is configured to change phase gradually over the course of the day, such that the phase change is completed at about dusk and the temperature of the thermal capacitor remains approximately the same throughout. In some examples, only a portion of thermal capacitor 26 may undergo the phase-change, or the thermal capacitor may only undergo a change in temperature.

As heat 30 is transferred through thermoelectric module 22, current is generated in a circuit 32 of the module. The thermoelectric module includes multiple legs 34 of a first material 36 having a negative Seebeck coefficient and a second material 38 having a positive Seebeck coefficient. Electrons are the dominant charge carriers in first material 36, while positively charged so called 'holes' are the dominant charge carriers in second material 38. Redistribution of the dominant charge carriers due to a thermal gradient across a leg results in a current, where the direction of the current depends on the Seebeck coefficient of the leg.

In other words, as heat 30 is transferred across legs 34 of thermoelectric module 22, a current is generated in each leg of first material 36 in a direction opposite the heat transfer. Similarly, a current is generated in each leg of second material 38 in the same direction as the heat transfer. As shown in FIG. 2, legs 34 are of alternating materials 36, 38 and are connected such that the current generated in each leg flows through circuit 32.

Because of the ambient temperature fluctuation, heat 30 transfers in alternating directions across thermoelectric module 22. Therefore, generated current flows in alternating directions in circuit 32. To allow appropriate power supply to a battery 42 or other device, a diode bridge 40 may be included in circuit 32 to convert the alternating current to a directed current.

Any thermoelectric material or materials may be used in thermoelectric module 22, including but not limited to n-doped and p-doped semiconductors. Nanostructured materials such as superlattices, quantum dots, nanowires, nanotubes, and nanocomposites may also be used. For example, a quantum well module may include legs comprised of a large number of at least two different very thin alternating layers of elements. Research into thermoelectric materials and generator design is ongoing, and any improvements found thereby may be included.

Thermoelectric module 22 may also be chosen or designed according to the expected ambient temperature range. Conversion efficiency of the thermoelectric module depends on the figure of merit (ZT) of the thermoelectric materials. Because the figure of merit for a material may in turn depend on the ambient temperature, materials may be selected that are appropriate to the temperature range of the intended installation location of energy harvester 10.

Some thermoelectric materials may possess superior thermal and/or electrical conductivity for a given temperature range. For example, semiconductors including alloys of Bismuth in combination with Antimony, Tellurium, or Selenium may be suited to lower temperatures. N and P dopant concentrations may also affect the temperature dependence of ZT. For an approximate expected Martian temperature range of minus 25 to minus 85 degrees celsius, a quantum well thermoelectric module may include legs of n-doped and p-doped Si/SiGe.

Atmospheric conditions on Mars may provide an environment with a thermodynamic potential particularly suited to efficient power production. As noted, temperatures may vary by about 60 degrees Celsius between daily highs and lows. Consider an example in which thermoelectric module 22 uses thermoelectric materials with ZT of 0.5. It may be noted that thermoelectric materials currently available have a best ZT of around 1. Assuming that thermal conductor 26 constitutes about 75% of the total weight of energy harvester 10, and that air flow heat capacity utilization is at about 50%, power generation for one year can be calculated by location as shown below.

| | Power Density | |
|---|---|---|
| Location | $\mu W/cm^2$ | mW/kg |
| Mars | 106 | 25.3 |
| Earth | 6 | 6.3 |

Note that $\mu W/cm^2$ is microwatts per square centimeter, and mW/kg is milliwatts per kilogram. Power density is a key measurement for equipment to be used in remote locations. Weight and volume represent transportation costs, especially for equipment that must leave a gravity well.

Average wind speed on Mars may be about 8 miles per hour, ranging up to 60 miles per hour during storms. The continually moving air of the almost constant wind may improve thermal transfer and allow more thermal energy to be harvested for a given temperature range. Variation in wind speed may make a combination of solar and thermal power generation advantageous. During storms, when solar arrays are at a lowest level of power production, the wind speeds would provide improved power production by the thermoelectric module. Similarly for calm periods of minimal wind, when the efficiency of the thermoelectric module may be reduced, the solar array may have best access to sunlight.

Thermal properties and spatial configuration of components of a thermal circuit of the energy harvester may also be selected to maximize power generation. The thermal circuit may include thermal capacitor 26, tank 24, thermoelectric module 22, and heat sink 16. In some examples, the circuit may also include other structural elements of energy harvester 10, additional heat sinks, and/or any other component participating in the desired transfer of heat from the environment to the thermal capacitor.

Thermal resistances may be minimized or limited in the thermal circuit, excluding thermoelectric module 22. Individual components may include materials with high thermal conductivity and may be shaped and arranged relative to one another such that heat transfer coefficients are increased. For example, heat sink 16 may include materials with high thermal conductivity such as copper or aluminum, and may have fins with a low aspect ratio. In some examples, thermal grease may be applied between the thermoelectric module and the heat sink for better heat transfer.

Additional components may be included to reduce thermal resistance. For example, powered fans may be positioned to improve air flow through heat sink 16. However, the resulting increase in power generation should outweigh the power requirements of the fans. In some examples, tank 24 may include a heat sink, grate, or heat pipe to improve conduction of heat from thermal capacitor 26.

The thermoelectric module may be configured to match the sum of all thermal resistances in the remainder of the thermal circuit. Alternatively, the thermal circuit may be configured such that the sum of all thermal resistances in the thermal circuit apart from the thermoelectric module is approximately equal to the thermal resistance of the thermoelectric module.

Thermal capacitor 26 may be selected to have a high heat capacity, high thermal conductivity, and/or a high latent heat of fusion. The volume of the thermal capacitor may be configured such that the total thermal capacity of the thermal capacitor closely matches the thermal energy transferred during half of an ambient temperature fluctuation cycle. The thermal capacitor may therefore store energy primarily as latent heat and not as sensible heat. In other words, the thermal capacitor may be configured such that heat is stored by undergoing a phase transition, rather than by altering in temperature.

Density of energy stored may be greater for latent heat than for sensible heat. Also, in such a configuration, thermal capacitor 26 may remain at approximately the same temperature throughout the ambient temperature fluctuation. Such temperature stability may be advantageous, as any change in the temperature of the thermal capacitor reduces the temperature difference across the thermoelectric module, reducing the rate of heat transfer and in turn reducing electrical power output.

A volume V appropriate for such a configuration may be calculated according to the below, where E is the thermal energy transferred to thermal capacitor 26 in each temperature fluctuation cycle according to the environmental conditions and properties of the energy harvesting device, p is the density of the thermal capacitor, and L is the latent heat of fusion of the thermal capacitor, $$V = \frac{E}{\rho L}$$

In such a configuration, the full volume of the thermal capacitor may complete a phase transition twice in each fluctuation cycle. For a greater volume of capacitor some portion of the volume may go unused. For a smaller volume, more heat may be transferred than can be stored as latent heat and the temperature of the thermal capacitor may vary.

Calculating this volume for an expected temperature range may allow selection of an appropriate size for tank 24. A smaller tank may represent less tank and insulation weight, but also less capacity for thermal capacitor 26 and potentially reduced efficiency. Allowance for typical aberrations from the daily temperature fluctuation may be made in the tank volume selection, balancing added weight against the potential for reduced efficiency. In some examples, weight savings may be considered a highest priority.

Transfer of heat through components not included in the thermal circuit, or by alternate paths may be limited. For example, main body 14 and insulation 28 may include materials with high thermal resistance. Ensuring that all, or a majority of heat transfer occurs across thermoelectric module 22 may improve efficiency of energy harvester 10.

The above described thermal and spatial properties of energy harvester 10 may be interrelated. As such, they may be most effectively optimized in coordination rather than separately. Constraints such as properties of commercially available components may also affect the efficiency that is practically achievable.

Figure 3:
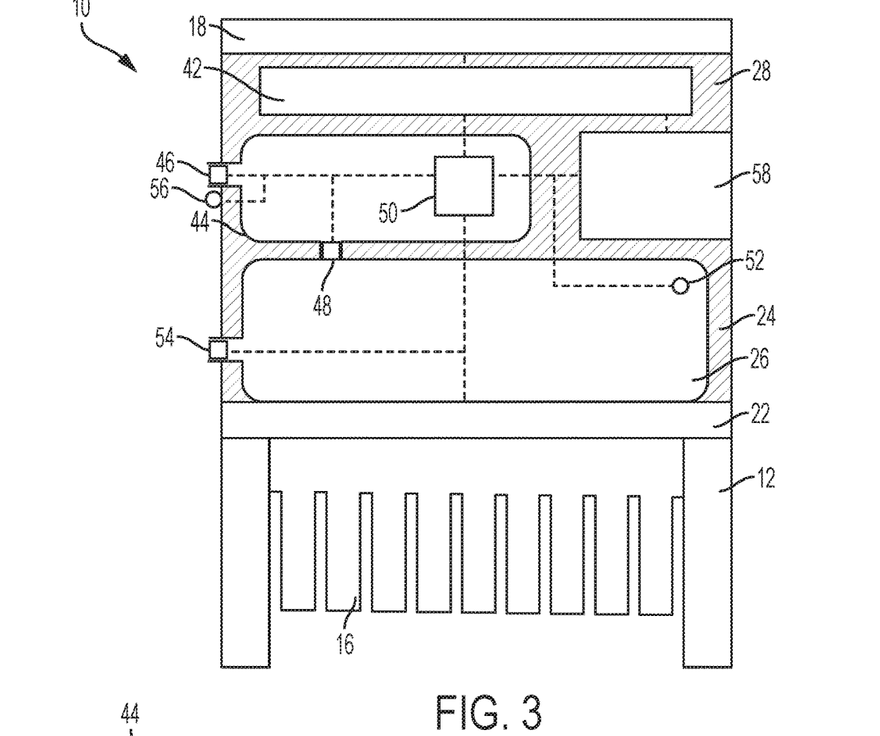
FIG. 3 is a schematic diagram of the energy harvester of FIG. 1.

FIG. 3 is a schematic diagram of energy harvester 10, including components not indicated in FIG. 2, such as solar panel 18. The solar panel is electrically connected to battery 42, and may charge the battery when sunlight is available. Battery 42 is also charged by thermoelectric module 22, which is sandwiched between tank 24 and heat sink 16. The thermoelectric module generates a current from a thermal gradient between thermal capacitor 26 in tank 24 and heat sink 16, as described above.

The energy harvester also includes a synthesis module 44 that is fluidly connected to the ambient air by an intake valve 46 and to tank 24 by an output valve 48. Synthesis module 44 is configured to produce thermal capacitor 26, which in the present example is a solution of ammonia in water. At the time of installation of energy harvester 10, tank 24 may be empty. Synthesis module 44 may produce a predetermined volume of thermal capacitor 26, and/or fill tank 24.

In some examples, synthesis module 44 may operate for a single period after installation of the energy harvester. A sufficient volume of thermal capacitor may be produced, and tank 24 may be sealed to prevent future changes in volume. In the present example, tank 24 includes an outlet valve 54. After the initial production of thermal capacitor 26, some volume of the capacitor may be released or evaporated from tank 24. Synthesis module 44 may then produce additional water or ammonia to add to thermal capacitor 26 in order to amend the concentration and thereby alter the phase-change temperature of the thermal capacitor. Such alterations may be referred to as tuning the thermal capacitor.

Production by synthesis module 44 is controlled or regulated by an electronic controller 50, which may be included in the synthesis module or in main body 14 of the energy harvester. The controller may further regulate power flow, input valve 46, output valve 48, outlet valve 54, and/or other functions of energy harvester 10. In some examples, controller 50 may include a processor, memory, and/or computer readable storage media. The controller may include one or more instructions stored in the computer readable storage media to execute a method of producing thermal capacitor 26.

A first sensor cluster 52 in electronic communication with controller 50 is disposed in tank 24. The sensor cluster may include a temperature sensor, a solution-concentration sensor, and/or sensors to gather any useful data. The sensors of cluster 52 may measure properties of thermal capacitor 26 and gathered data may be communicated to controller 50. For example, a solution-concentration sensor of cluster 52 may communicate a reading indicating a concentration of ammonia in thermal capacitor 26 and in response controller 50 may direct synthesis module 44 to release additional ammonia into tank 24, bringing the concentration to a desired level.

A second sensor cluster 56 in electronic communication with controller 50 is disposed external to main body 14, proximate intake valve 46. The sensor cluster may include a temperature sensor, a wind-speed sensor, and/or sensors to gather any useful data. The sensors of cluster 52 may measure properties of the ambient air or environment and gathered data may be communicated to controller 50. For example, a temperature sensor of cluster 56 may measure ambient temperature in regular intervals over a period of multiple days. Controller 50 may thereby calculate an average temperature, and may tune the thermal capacitor accordingly.

In some examples, data gathered by sensor cluster 56 may additionally or alternatively be communicated to synthesis module 44. Properties such as chemical composition or temperature of the ambient air relevant to synthesis may be measured. Locating sensor cluster 56 proximate intake valve 46, and/or integrating the sensor cluster with the intake valve may allow effective evaluation of air taken in by the energy harvester, and responsive adjustment of the synthesis module, if appropriate. Inaccuracies due to local ambient variations may therefore be avoided.

An equipment bay 58 is also included in main body 14 of energy harvester 10. The bay is configured to receive one or more equipment units conforming to some electrical and/or dimensional standard. A power supply drawing from battery 42 to supply compatible voltage and current to the equipment units is included in the bay. Equipment bay 58 may also include fasteners or supports appropriate to secure the one or more units in main body 14.

As depicted in FIG. 3, equipment bay may be exposed to the environment to allow sensors to take readings or samples to be collected. For example, a soil analysis unit may be fitted in equipment bay 58 and may collect samples of wind-borne dust for analysis. In some examples, electronics bay 58 may be mounted in main body 14 such that the bay is surrounded by insulation 28 and/or is in thermal communication with synthesis module 44. Temperature sensitive equipment may be thereby insulated from environmental temperatures and may be heated by waste heat from exothermic reactions in synthesis module 44.

The equipment bay may facilitate use of energy harvester 10 to power a variety of equipment. Equipment units may also be changed, replaced, or upgraded. For a fleet of energy harvesters, each harvester may be fitted with different equipment. For example, a set of energy harvesters may be included in a flight to Mars, each including one of a pressure sensor, a temperature sensor, a radiation sensor, and a humidity sensor. Another example of equipment that may be powered by energy harvester 10 is a sensor to detect signs of life. For instance, the instrument Urey: Mars Organic and Oxidant Detector may be installed in the equipment bay of an energy harvester deployed on Mars. For another instance, a suite of sensors for analyzing atmosphere and detecting biosignature gases may be powered by an energy harvester included in a mission to Saturn's moon Enceladus.

In some examples, equipment bay 58 may be located appropriately for a specific type of measurement. For instance, the equipment bay may be mounted at a top surface of main body 14 to house instruments requiring a clear view of the sky. In some examples, equipment in bay 58 may perform measurements or other operations on ambient air, and the bay may be located proximate intake 46 so that incoming air may be split between the bay and synthesis module 44.

Figure 4:
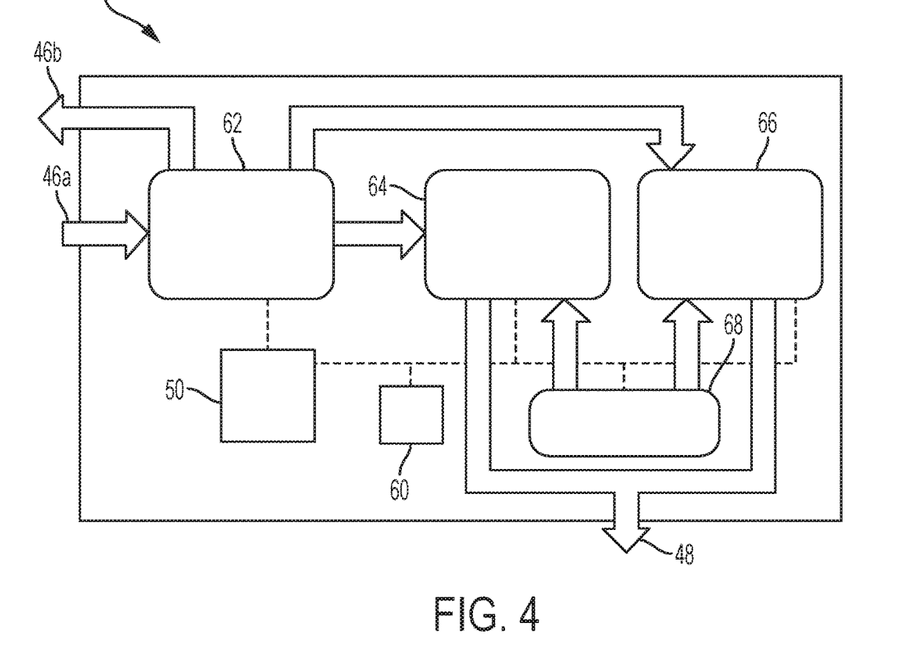
FIG. 4 is a schematic diagram of the synthesis module of the energy harvester of FIG. 1.

FIG. 4 is a schematic diagram of synthesis module 44. During production of thermal capacitor 26, synthesis module 44 draws operational power from battery 60. Alternatively or in addition, the synthesis module may draw power from battery 42, which may be pre-charged and/or charged by solar panel 18.

The synthesis module includes three chemical process modules, an extraction module 62, a water production module 64, and an ammonia production module 66. The number and type of modules may vary based on the chemical composition of thermal capacitor 26 and the ambient air. Similarly dependent is a reservoir 68, which may include any chemical constituents needed for synthesis of thermal capacitor 26 that cannot be feasibly extracted from the ambient air. In the present example, reservoir 68 holds hydrogen gas. The quantity of hydrogen may be sufficient to synthesize the desired volume of thermal capacitor 26, and in some examples may include additional hydrogen for use in tuning of the thermal capacitor.

Suitable chemical processes for each module may be selected based on factors such as size and weight of equipment needed, power draw, and temperature extremes reached. In some examples, processes requiring equipment of less weight may be selected over processes having higher efficiency. Similarly, reaction speed may be considered less important than scalability.

As shown in FIG. 4, intake valve 46 of synthesis module 44 includes both an intake 46a and an exhaust 46b. Ambient air is passively accepted by intake 46a, and communicated to extraction module 62. The intake may include filters to prevent the admission of dust, and in some examples may include means of active air intake such as a fan.

Extraction module 62 isolates the chemical constituents of the ambient air to be used in synthesis of thermal capacitor 26, and returns the remaining material to the environment through exhaust 46b. In the present example, module 62 extracts oxygen and nitrogen from Martian air. The Martian atmosphere includes approximately 96% carbon dioxide and approximately 2% nitrogen, but only traces of oxygen. Therefore, an efficient method of obtaining oxygen may include disassociation of carbon dioxide.

Methods of extracting atmospheric nitrogen and of disassociating carbon dioxide are well known to those skilled in the art, and any effective methods may be used. For example, solid oxide electrolysis or an ultraviolet (UV) laser technique may be used to disassociate carbon dioxide while air separation methods such as pressure swing adsorption or fractional distillation may be used to extract nitrogen.

Extracted nitrogen is communicated to ammonia production module 66, and extracted oxygen is communicated to water production module 64. Water module 64 draws hydrogen from reservoir 68 to combine with the oxygen to produce water. In some examples, module 64 may be a hydrogen fuel cell. In addition to producing water, the fuel cell may generate electricity to charge battery 60, battery 42, and/or directly power any components of synthesis module 44.

Ammonia module 66 fixes the extracted nitrogen from extraction module 62 with hydrogen from reservoir 68 to produce ammonia. Methods of ammonia production are well known to those skilled in the art, and any effective method may be used. For example, module 66 may include a catalyst and the Haber process may be used.

Ammonia produced by module 66 is dissolved into water produced by module 64 to produce an aqueous solution of ammonia. The combination may be facilitated either in synthesis module 44 or in tank 24. In examples where thermal capacitor 26 is tunable, dissolving the ammonia in tank 24 may be preferable so that small quantities of ammonia or water may be added to tank 24 to adjust concentration instead of re-synthesizing the full volume of the thermal capacitor at a new concentration.

B. Illustrative Terrestrial Energy Harvester

Figure 5:
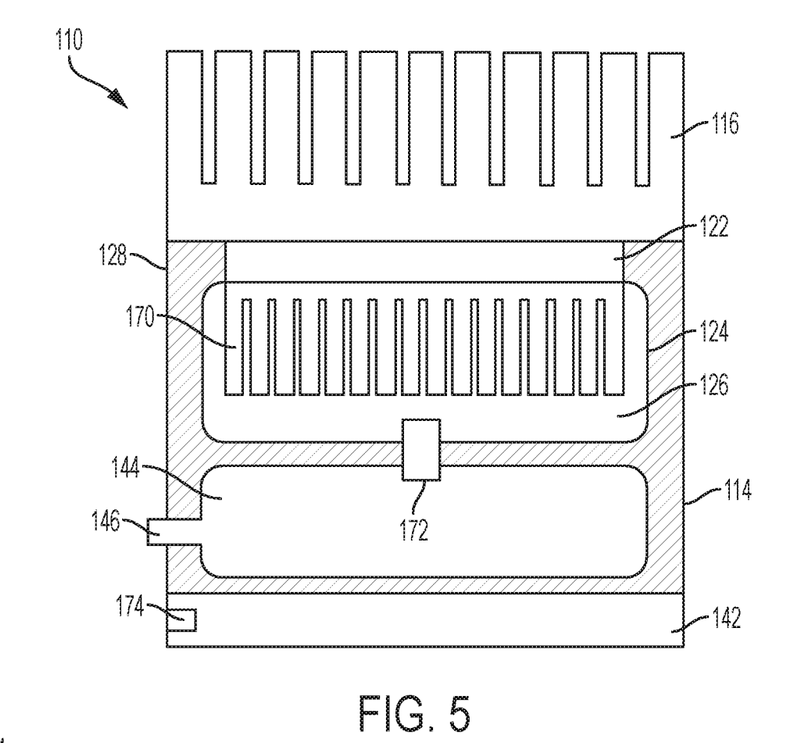
FIG. 5 is a schematic diagram of another illustrative energy harvester.

FIG. 5 is a schematic diagram of an energy harvester 110, which is another example of an energy harvesting apparatus, as described above. Accordingly, components similar to energy harvester 10 may be labeled with similar reference numbers.

Energy harvester 110 is configured for use in a terrestrial environment. For example, the energy harvester may be carried by soldiers in the field to deploy with communications equipment. Weather stations including an energy harvester may be deployed by aircraft in rugged or hazardous terrain, and transmit environmental data via satellites. In some examples, multiple energy harvesters may be connected as an array for increased power output. Connected energy harvesters may be configured to communicate with one another using radio frequency (RF) technology.

Weather conditions, and inconsistent temperature fluctuations in some locations may make substantial power buffering or multi-source power systems advantageous. For example, energy harvester 110 may be included in a power grid using pumped storage hydroelectricity to store power generated during favorable weather.

As shown in FIG. 5, energy harvester 110 includes a battery 142, a main body 114, and a heat sink 116. Housed in the main body are a synthesis module 144, a tank 124, and a thermoelectric module 122. The thermoelectric module is in contact with tank 124 and heat sink 116, allowing heat transfer across the module between the environment and a thermoelectric capacitor 126 stored in tank 124. A heat transfer unit 170 is mounted inside tank 124 to improve thermal conduction from thermal capacitor 126 to thermoelectric module 122. In some examples, the heat transfer unit may be a finned heat sink, a conductive grate, or a heat pipe.

The thermoelectric module may be any effective device for generating electrical current from a temperature gradient. In some examples, thermoelectric module 122 may be designed for efficiency in the ambient temperature range. For instance, at terrestrial temperatures a quantum well device may have n-type legs that are alternating layers of silicon and silicon carbide and p-type legs that are alternating layers of different stoichiometric forms of B—C.

Proximate one side of thermoelectric module 122, is heat sink 116. The heat sink is mounted on top of main body 114, raising the heat sink off the ground to take advantage of the wind speed gradient. In some examples, energy harvester 110 may also be mounted on top of other equipment, to further improve the wind speed experienced by heat sink 116.

Battery 124, which may represent a significant portion of the weight of energy harvester 110, is mounted at the bottom of main body 14 and may improve stability in windy conditions. The energy harvester and components are depicted as rectangular, but may have any effective shape. For example, main body 14 may have a cylindrical shape to reduce the ratio of surface area requiring insulation to insulated volume, and the energy harvester may be broader than it is tall for improved wind resistance.

Battery 124 also includes a standard electrical connector 174. The connector may allow power to be drawn from energy harvester 110, to power other equipment. For example, a water quality monitoring device may be mounted in a remote natural reservoir and connected to the energy harvester by electrical cabling. In some examples, energy harvester 110 may be collected after a period of operation and re-deployed to power different equipment.

Synthesis module 144 is in fluid communication with the ambient air via port 146, and with tank 124 via pump 172. The synthesis module produces thermal capacitor 126 from the ambient air. Pump 172 allows the fluid thermal capacitor to be communicated up to tank 124. In the present example, the thermal capacitor is an aqueous solution of ammonia synthesized from water, hydrogen, and nitrogen extracted from the air. In some examples, thermal capacitor 126 may be water condensed from humid atmospheric air. Any substance of sufficient heat capacity and thermal conductivity may be used for thermal capacitor 126.

Figure 6:
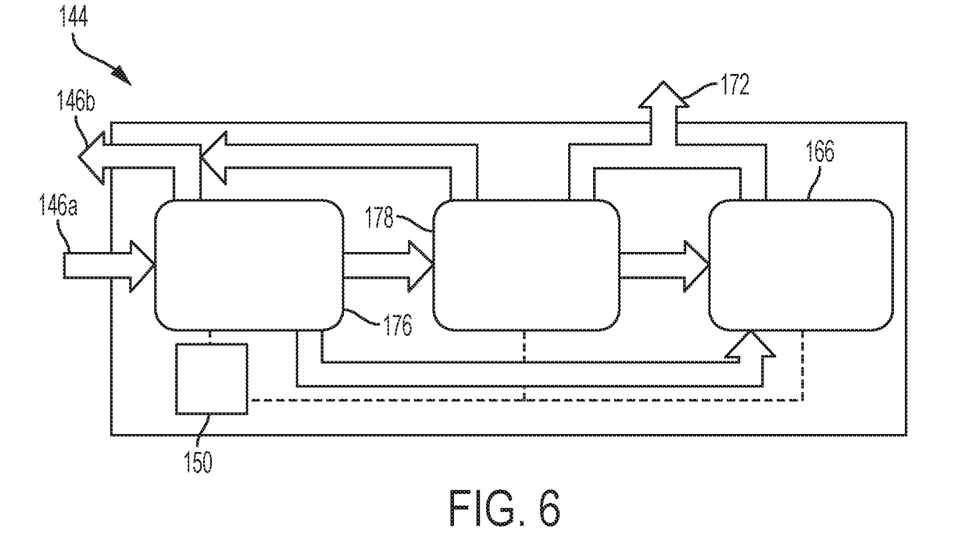
FIG. 6 is a schematic diagram of the synthesis module of the energy harvester of FIG. 5.

FIG. 6 is a schematic diagram of synthesis module 144, showing three chemical process modules. The synthesis module includes an air separation module 176, an electrolysis module 178, and an ammonia production module 166. Ambient air is accepted by an intake 146a of port 146, and communicated to air separation module 176. Nitrogen and water are separated out of the air by the separation module, using a membrane gas separation process and condensation in the present example. Remaining material is returned to the environment through an exhaust 146b.

Some fraction of the water is communicated to electrolysis module 176, which decomposes the water into hydrogen and oxygen using an electrolytic cell. The hydrogen is communicated to ammonia production module 166, while the oxygen is vented through exhaust 146b.

Ammonia is produced in module 166 with the nitrogen from air separation module 176 and the hydrogen from electrolysis module 178. The ammonia is in turn dissolved in the remaining water from air separation module 176, and communicated by pump 172 into tank 124. A tuning control 150 regulates the volume of ammonia solution produced and the concentration of the solution.

C. Illustrative Method of Harvesting Energy

Figure 7:
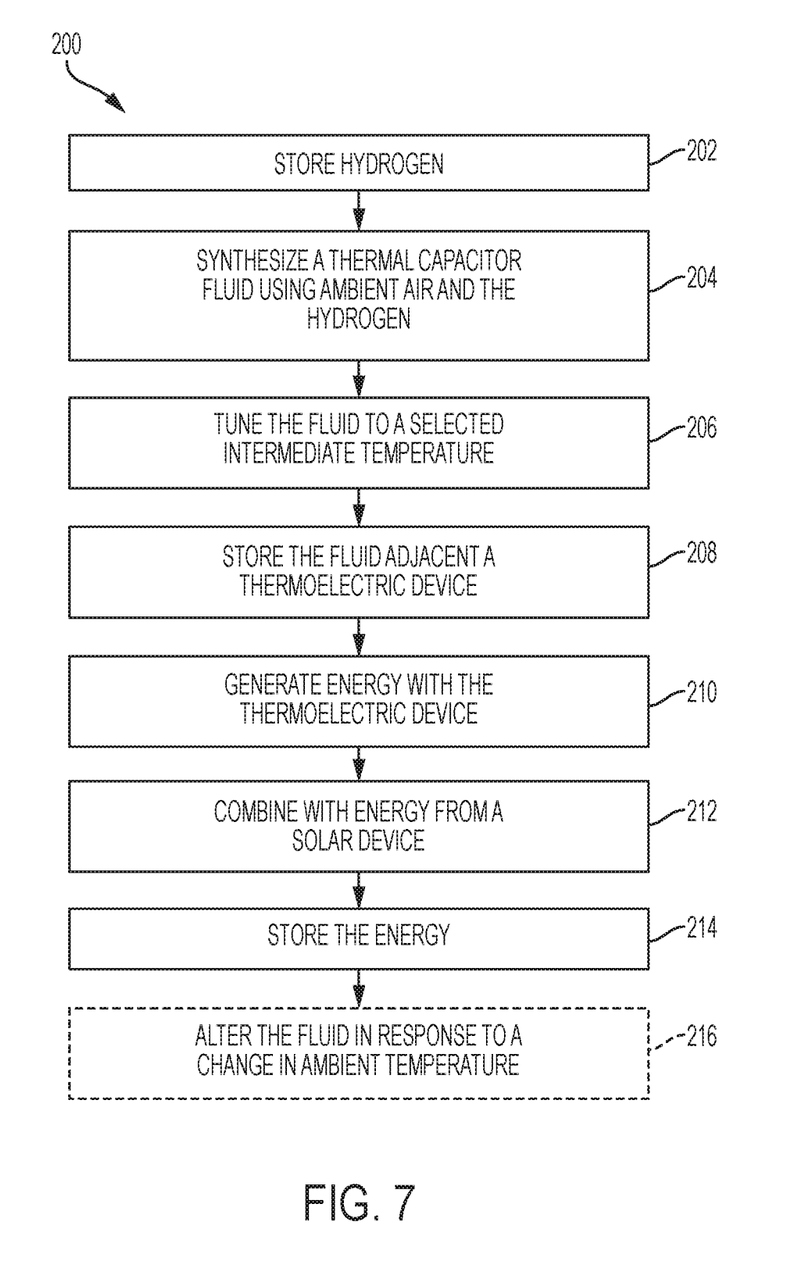
FIG. 7 is a flow chart depicting steps of an illustrative method of harvesting energy.

This section describes steps of an illustrative method for harvesting energy; see FIG. 7. Aspects of energy harvesters described above may be utilized in the method steps described below. Where appropriate, reference may be made to components and systems that may be used in carrying out each step. These references are for illustration, and are not intended to limit the possible ways of carrying out any particular step of the method.

FIG. 7 is a flowchart illustrating steps performed in an illustrative method, and may not recite the complete process or all steps of the method. Although various steps of method 200 are described below and depicted in FIG. 7, the steps need not necessarily all be performed, and in some cases may be performed simultaneously or in a different order than the order shown.

At step 202, method 200 includes storing hydrogen. The hydrogen may be stored in a lightweight tank included in an apparatus for harvesting energy. The volume or mass of hydrogen stored may be limited to reduce the weight of the apparatus.

Step 204 of method 200 includes using the stored hydrogen with ambient air to synthesize a thermal capacitor fluid. Any solution with effective thermal capacitance may be synthesized, including an aqueous ammonia solution. The chemical processes appropriate for synthesis may depend on the abundance of needed chemicals in the ambient air. For example, in the Martian atmosphere abundant nitrogen may be extracted directly, while oxygen may be produce by disassociating carbon dioxide. The oxygen may be combined with the stored hydrogen to produce water, and the nitrogen may be fixed with the stored hydrogen to produce ammonia.

At step 206 method 200 includes tuning the thermal capacitor fluid to a selected intermediate temperature of the environment. Solute concentration of the fluid may be modified to adjust the phase change temperature of the thermal capacitor fluid to the selected intermediate temperature. The environment may undergo a periodic temperature fluctuation, and the selected intermediate temperature may be within the range of that fluctuation. In some examples, the selected temperature may be the median of the range. In some examples, the temperature fluctuation of the environment may be inconsistent and the selected temperature may correspond to an average over multiple fluctuations.

Tuning the thermal capacitor fluid may include modifying solute concentration, and/or a quantity of the thermal capacitor fluid. The quantity of solution may be matched to the available thermal energy of the temperature fluctuation of the environment, such that the complete quantity of solution undergoes a phase-change during each half of the temperature fluctuation and such that the temperature of the solution remains at approximately the selected intermediate temperature throughout the temperature fluctuation.

At step 208, the method includes storing the fluid adjacent a thermoelectric device. The thermal capacitor fluid may be stored in a lightweight tank, the tank having low thermal resistance. Heat transfer between the thermoelectric fluid and a first side of the thermoelectric device may be facilitated by the tank and/or other components of the energy harvesting apparatus. For example, the tank may be shaped to promote heat transfer, and/or a heat sink may be mounted in the tank.

The thermal capacitor may be stored such that thermal communication with the environment is limited. For example, the storage tank may be insulated. The thermoelectric device may be disposed such that a second side of the device is in thermal communication with the environment. In some examples, a heat sink may be disposed proximate the second side of the thermoelectric device to facilitate heat transfer between the thermoelectric device and the environment.

The energy harvesting apparatus, which may include the thermal capacitor storage tank and the thermoelectric device, may be configured to create a temperature gradient between the first and second sides of the thermoelectric device. The temperature gradient may fluctuate according to the temperature fluctuation of the environment, and may reverse direction. The temperature gradient may result from a temperature difference between the thermal capacitor fluid and the environment.

Step 210 of method 200 includes generating energy with the thermoelectric device. The thermoelectric device may include materials of positive and negative Seebeck coefficient, arranged such that the temperature gradient across the thermoelectric device creates an electromotive force resulting in a current through a circuit of the thermoelectric device. Reversals in the direction of the temperature gradient may result in alternation of the current. The circuit may therefore also include a diode bridge or other rectifier to convert the alternating current to a direct current.

In some examples, generated current may be used to heat temperature sensitive components of the energy harvesting apparatus or of associated equipment. In such examples, a diode bridge may be unnecessary, as the conversion of electrical current to heat is current direction agnostic.

At Step 212, the method includes combining the generated energy with energy from a solar device. The energy harvesting apparatus may also include a solar cell array, or any effective solar device. The thermal and solar energy may be combined by an electrical system of the energy harvesting apparatus, or energy from both devices may be communicated to other electrical equipment.

Step 214 of the method includes storing the combined energy. A battery or other electrical storage device may be included in the circuit of the thermoelectric device or otherwise connected to the thermoelectric device, and/or may be included in the electrical system of the energy harvesting apparatus or otherwise connected to the energy harvesting apparatus. The electrical storage device may be used to store electrical energy generated by the thermoelectric device and/or the solar device.

In some examples, the generated energy may be communicated from the energy harvesting apparatus to a power grid, or energy from multiple energy harvesting apparatus may be communicated to a shared battery. Any effective method of storing the generated electrical energy may be used.

In response to a change in the ambient temperature range, optional step 216 of the method may be performed. The step includes altering the thermal capacitor ammonia solution. The alteration may comprise re-tuning the solution to a new selected intermediate temperature of the changed ambient temperature range. In some examples, re-tuning may include releasing or evaporating some of the solution, adding additional solute and/or solvent to modify the concentration of the solution, and/or modifying the overall quantity of the solution.

Optional step 216 may be repeated in response to each change in ambient temperature range, or may be repeated for changes of a specific type and/or above a specific threshold for a measurement of the change. In some examples, optional step 216 may be performed in response to an alteration in some property of the energy harvesting apparatus.

D. Illustrative Method of Generating a Thermal Capacitor

This section describes steps of an illustrative method for generating a thermal capacitor. Aspects of energy harvesters or synthesis modules described above may be utilized in the method steps described below. Where appropriate, reference may be made to components and systems that may be used in carrying out each step. These references are for illustration, and are not intended to limit the possible ways of carrying out any particular step of the method.

Figure 8:
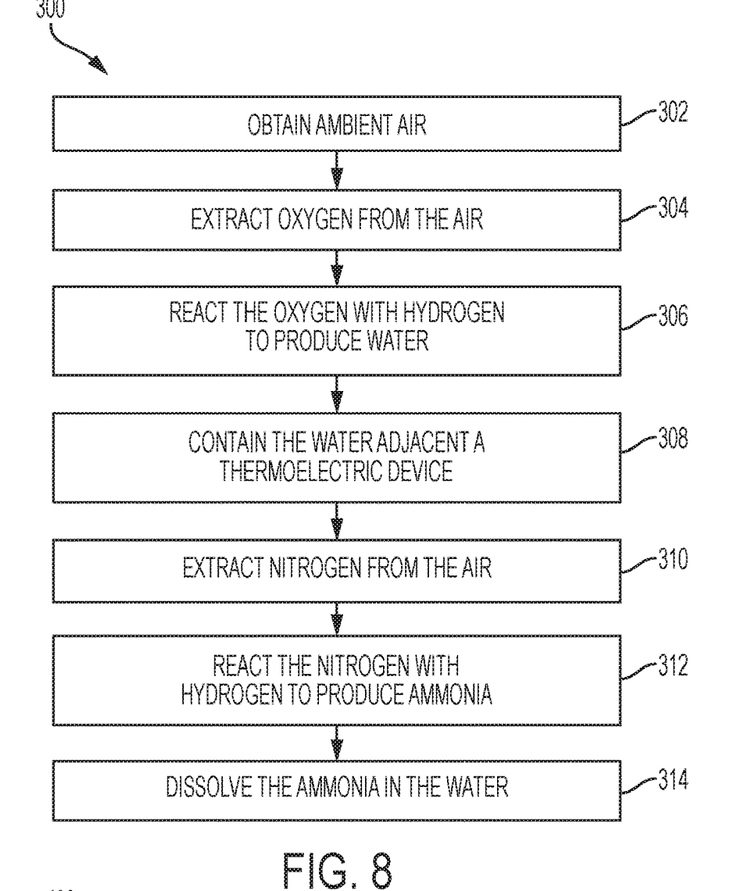
FIG. 8 is a flow chart depicting steps of an illustrative method of generating a thermal capacitor.

FIG. 8 is a flowchart illustrating steps performed in an illustrative method, and may not recite the complete process or all steps of the method. Although various steps of method 300 are described below and depicted in FIG. 8, the steps need not necessarily all be performed, and in some cases may be performed simultaneously or in a different order than the order shown.

At step 302, the method includes obtaining ambient air. The ambient air may be any gaseous environment that contains oxygen and nitrogen, including artificially processed air or atmospheric air. For example, the ambient air may be obtained from the atmosphere of another planet, such as Mars. The air may be passively obtained by atmospheric pressure, actively obtained by use of a mechanism such as a fan, and/or by any effective method. The obtained air may be stored, or may be communicated directly to a chemical processing unit.

Step 304 includes extracting oxygen from the obtained ambient air. For air having free oxygen, air separation techniques such as pressure swing adsorption or chemisorptive organic molecules may be used to extract the oxygen. In some environments, oxygen may be disassociated from a compound such as carbon dioxide using methods such as solid oxide electrolysis or UV laser disassociation may be used.

At step 306, method 300 includes reacting the oxygen with hydrogen to produce water. A catalyst such as platinum may be used to facilitate a controlled reaction. In some examples, the reaction may be performed with a fuel cell to allow the energy of the exothermic reaction to be captured and used to power endothermic reactions of method 300. Other methods of capturing released energy may also be used.

Step 308 includes storing the resulting water in a thermal capacitor container adjacent a thermoelectric device. The container and the thermoelectric device may be part of an energy harvester such as those described in examples A and B, above.

At step 310, the method includes extracting nitrogen from the obtained ambient air. The nitrogen extraction may be performed before, after, or concurrently with the oxygen extraction of step 304. An air separation process such as pressure swing adsorption, a membrane technology, or any effective method may be used to extract nitrogen.

Step 312 includes reacting the nitrogen with hydrogen to produce ammonia. In some examples, such as for an ambient air having abundant nitrogen, step 310 may be omitted and nitrogen may be fixed directly from the ambient air. A catalyst mediated process such as the Haber process, or any effective method may be used to produce ammonia.

At step 314 method 300 includes dissolving the produced ammonia in the water stored in the thermal capacitor container. The ammonia may be dissolved at a concentration configured to tune the melting or freezing point of the water to correspond to a selected temperature, where the selected temperature is an intermediate temperature of a selected environment. For example, the ammonia-water solution may be tuned to have a freezing point corresponding to an average temperature at dawn for a location on Mars. The selected temperature may correspond to a measured intermediate temperature, or to a predicted intermediate temperature.

Method 300 may be performed using any of the above described energy harvesting apparatus, or the synthesis modules thereof. In some examples, the method may be implemented by an electronic controller of a synthesis module. The electronic controller may include a processor, and may be configured to control synthesis of the aqueous ammonia solution and delivery to the thermal capacitor container.

Method 300 may also be performed by any equipment requiring thermal energy storage. In electronics, an electrical capacitor may be used to manage fluctuations in voltage or current. Similarly, a thermal capacitor generated by method 300 may be used to manage temperature fluctuations. Some equipment, particularly electrical equipment may be sensitive to sudden change or extreme changes in temperature.

For example, Thermal Energy Storage (TES) is a known technique for managing thermal systems using a Phase Change Material (PCM). A PCM may be generated using method 300, and tuned to operative conditions. For instance, avionics equipment rejects a significant heat load to the environment and TES systems can delay temperature rise for increased load in situations such as reduced air cooling while an aircraft remains on the tarmac. A PCM for the avionics may be tuned by method 300 to a temperature range experienced by the avionics bay of a particular aircraft.

In some examples, equipment utilizing TES may operate in a remote location and require transport to the location. Use of method 300 to generate the PCM may reduce transport weight and costs, while allowing effective TES on-site.

E. Illustrative Method of Establishing an Energy Harvesting Station

This section describes steps of an illustrative method for establishing an energy harvesting station on a remote planet. Aspects of energy harvesters, methods of energy harvesting described, and/or methods of producing a thermal capacitor described above may be utilized in the method steps described below. Where appropriate, reference may be made to components and systems that may be used in carrying out each step. These references are for illustration, and are not intended to limit the possible ways of carrying out any particular step of the method.

Figure 9:
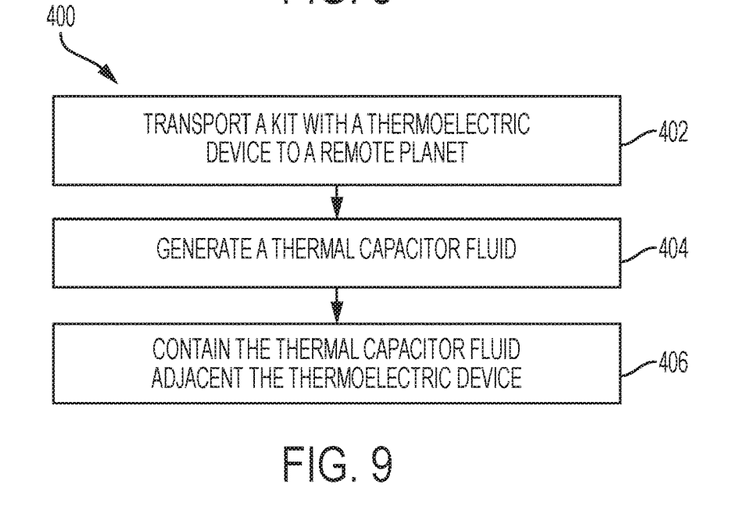
FIG. 9 is a flow chart depicting steps of an illustrative method of establishing an energy harvesting station on a remote planet.

FIG. 9 is a flowchart illustrating steps performed in an illustrative method, and may not recite the complete process or all steps of the method. Although various steps of method 400 are described below and depicted in FIG. 9, the steps need not necessarily all be performed, and in some cases may be performed simultaneously or in a different order than the order shown.

At step 402, the method includes transporting a kit with a thermoelectric device to a remote planet. The thermoelectric device may be included in an energy harvesting apparatus as described above. In some examples the kit may be included in a mission to another planet, such as a manned mission or a rover mission. For such examples, the kit may include components of an energy harvester, to be assembled once landed on the planet. The kit may be packed with other cargo of the mission, and deployed by mission members or automated systems such as a rover. As any thermal capacitor needed for energy harvesting may be generated by an energy harvester subsequent to installation, the kit may be lightweight and therefore suitable for transport.

In some examples, the kit may be separately deployed to a planetary surface. For example, a kit may be landed on Mars using an airbag landing system such as the one demonstrated in NASA's deployment of the Mars Pathfinder mission. The landing may also be accomplished with a rocket-powered descent stage and sky crane as demonstrated by NASA's Mars Curiosity rover. Any effective landing method may be used. The kit may also be configured to facilitate landing, for instance being deployable in multiple orientations to reduce the precision required in landing.

Step 404 of method 400 includes generating a thermal capacitor fluid. The fluid may be synthesized from the planetary atmosphere. For example, method 300 may be used to generate an aqueous ammonia solution capacitor. Any effective thermal capacitor may be generated, according to any effective method. A capacitor and/or method of synthesis may be selected based on elements available in the planetary atmosphere and an ambient temperature range on the planet's surface. In some examples, the kit may include necessary chemical elements or compounds not present in sufficient concentration in the atmosphere. For instance, gaseous hydrogen may be included in a kit transported to Mars because the gas is significantly lighter than the water-based thermal capacitor it may be used to generate.

At step 406, the method includes containing the thermal capacitor fluid in a container adjacent the thermoelectric device. The thermal capacitor container may be a lightweight tank, or in some examples may be a pressurized vessel. The thermal capacitor and thermoelectric device may be used to generate electricity according to method 200, described above. The thermal capacitor, container, and thermoelectric device may also form part of an energy harvesting apparatus as described above.

F. Additional Examples and Illustrative Combinations

This section describes additional aspects and features of an energy harvesting apparatus and related methods, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. An energy harvesting apparatus, comprising:
a thermoelectric device,
a heat exchanger coupled to the thermoelectric device,
a thermal capacitor generation device configured to generate a thermal capacitor fluid,
a thermal capacitor container for containing the thermal capacitor fluid generated by the thermal capacitor generation device, and
a first electrical energy storage device electrically connected to the thermoelectric device for storing electricity generated by the thermoelectric device.

A1. The apparatus of A0, wherein the thermal capacitor generation device uses ambient air to synthesize the thermal capacitor fluid.

A2. The apparatus of A0, wherein the thermal capacitor generation device is configured to synthesize water.

A3. The apparatus of A0, wherein the thermal capacitor generation device is configured to synthesize an aqueous ammonia solution tuned to change phase at a selected intermediate temperature of a selected environment.

A4. The apparatus of A3, wherein the thermal capacitor generation device is configured to alter the concentration of ammonia in the aqueous ammonia solution to adjust the melting temperature of the thermal capacitor fluid in response to a change in an ambient temperature range.

A5. The apparatus of A3, wherein the selected intermediate temperature is the average temperature at dawn in the selected environment.

A6. The apparatus of A3, wherein the selected environment is on Mars.

A7. The apparatus of A0, further comprising a solar energy harvesting device electrically connected to the first electrical energy storage device.

A8. The apparatus of A7, wherein the solar energy harvesting device is configured to supply electricity to the thermal capacitor generation device for the purpose of synthesizing the thermal capacitor fluid.

A9. The apparatus of A7, wherein the thermal capacitor container is sandwiched between the thermoelectric device and the solar energy harvesting device.

A10. The apparatus of A0, wherein the heat exchanger transfers energy between the environment and the thermal capacitor.

A11. The apparatus of A0, wherein the thermal capacitor stores energy using a liquid-to-solid phase change, and wherein the phase change is tuned to occur at a selected intermediate temperature of a selected environment.

A12. The apparatus of A0, wherein the thermal capacitor generation device includes a second electrical energy storage device.

A13. The apparatus of A0, wherein the thermal capacitor generation device includes a source of hydrogen.

A14. The apparatus of A0, wherein the heat exchanger is positioned adjacent a first side of the thermoelectric device, and the thermal capacitor container is positioned adjacent a second side of the thermoelectric device, the first side of the thermoelectric device being opposite from the second side.

A15. The apparatus of A0, wherein the apparatus is included in a vehicle.

A16. The apparatus of A15, wherein the vehicle is a space exploration vehicle.

B0. A method of harvesting energy comprising:
storing hydrogen in an energy harvesting apparatus, wherein the energy harvesting apparatus includes a thermoelectric device and a first energy storage device,
synthesizing a thermal capacitor fluid comprising aqueous ammonia solution, using ambient air, the stored hydrogen, and energy from the first energy storage device, and storing the ammonia solution in a thermal capacitor container adjacent the thermoelectric device, and
generating electrical energy using ambient environmental atmosphere and the thermal capacitor fluid in thermal communication with the thermoelectric device.

B1. The method of B0, further comprising:
storing electrical energy generated in the generating step in a second energy storage device.

B2. The method of B0, further comprising:
tuning the ammonia solution to change phase at a selected intermediate temperature of a selected environment.

B3. The method of B2, further comprising:
altering the ammonia solution to adjust the melting temperature in response to a change in an ambient temperature range.

B4. The method of B2, wherein the selected environment is on Mars.

B5. The method of B0, further comprising:
combining energy generated by a solar energy harvesting device with energy generated by the thermal electric device.

C0. A portable thermal capacitor generator, comprising:
a thermal capacitor fluid container,
a hydrogen source,
a battery,
a synthesis housing structure having an intake port configured to take in ambient air from a planetary environment, and
a processor configured to control synthesis of an aqueous ammonia solution using ambient air, electricity from the battery, and hydrogen from the hydrogen source, wherein the synthesis housing structure is configured to deliver the aqueous ammonia solution to the thermal capacitor fluid container.

C1. The portable thermal capacitor generator of C0, wherein the planetary environment is Mars.

C2. The portable thermal capacitor generator of C0, wherein the thermal capacitor fluid container is included in a system configured to reduce a rate of temperature change.

D0. A method of generating a thermal capacitor, comprising:
obtaining ambient air from Mars,
extracting oxygen from the air,
reacting the oxygen with hydrogen to produce water, and
containing the water in a thermal capacitor container adjacent a thermoelectric device.

D1. The method of D0, further comprising:
extracting nitrogen from the air,
reacting the nitrogen with hydrogen to produce ammonia, and
dissolving the ammonia in the water at a concentration configured to tune the melting point of the water to correspond to a selected intermediate temperature of a selected environment.

D2. The method of D1, wherein the selected intermediate temperature is the average temperature at dawn in the selected environment.

D3. The method of D1, wherein the selected environment is on Mars.

D4. The method of D1, further comprising communicating the water and dissolved ammonia to a system configured to reduce a rate of temperature change.

D5. The method of D1, further comprising communicating the water and dissolved ammonia to a thermal energy storage apparatus.

E0. A method of establishing an energy harvesting station on a remote planet, comprising:

transporting an energy harvesting kit from earth to a remote planet, the kit including a thermoelectric device and a portable thermal capacitor generation device, and generating a thermal capacitor fluid on the remote planet, and containing the thermal capacitor fluid in a thermal capacitor container adjacent the thermoelectric device.

E1. The method of E0, wherein the remote planet is Mars.

F0. A tunable thermal capacitor, comprising:

a thermal capacitor container containing water, a synthetic apparatus configured to generate ammonia using ambient air and a hydrogen source, the apparatus being fluidly connected to the thermal capacitor container for adding ammonia to the water producing an aqueous ammonia solution, and a controller configured to alter the ammonia concentration in the solution, and a corresponding melting point of the solution to a desired intermediate temperature in a selected ambient environment.

F1. The tunable thermal capacitor of F0, wherein the aqueous ammonia solution is in thermal communication with a temperature sensitive apparatus and is configured to reduce a rate of temperature change of the apparatus.

F2. The tunable thermal capacitor of F0, wherein the aqueous ammonia solution is in thermal communication with a temperature sensitive apparatus and is configured to reduce a temperature change of the apparatus.

G0. A method of harvesting energy comprising: synthesizing a thermal capacitor fluid comprising aqueous ammonia solution, using ambient air, and storing the ammonia solution in a thermal capacitor container adjacent a thermoelectric device, and generating electrical energy using the thermoelectric device, ambient environmental atmosphere, and the thermal capacitor fluid in thermal communication with the thermoelectric device.

H0. A thermoelectric energy collector for use in a fluid environment, comprising:

an insulated container for a thermal capacitor fluid;

a thermoelectric generator having a first side in thermal communication with the container;

a heat sink exposed to the fluid environment and in thermal communication with a second side of the thermoelectric module; and a chemical processing module in fluid communication with the container and the environment, and configured to synthesize the thermal capacitor fluid from the environment and any included chemical ingredients;

wherein the fluid environment undergoes periodic fluctuations within a temperature range, and the thermal capacitor fluid has a liquid to solid phase transition at a temperature within the temperature range.

H1. The collector of H0, wherein the thermal resistance of the heat sink is approximately equal to the thermal resistance of the thermal capacitor fluid.

H2. The collector of H0, wherein the thermal capacitor fluid is a solution of ammonia in water.

H3. The collector of H2, wherein the concentration of the ammonia is adjustable.

H4. The collector of H0, further including a power source for the chemical processing module.

H5. The collector of H4, wherein the power source includes a photovoltaic cell.

H6. The collector of H0, wherein the chemical processing module includes a reservoir of Hydrogen.

H7. The collector of H6, wherein the fluid environment is the atmosphere of Mars.

Advantages, Features, Benefits

The different embodiments and examples of the energy harvesting apparatus described herein provide several advantages over known solutions for harvesting energy from the environment. For example, illustrative embodiments and examples described herein allow a lightweight power supply device suitable for transportation over long distances, into difficult terrain, or off-planet.

Additionally, and among other benefits, illustrative embodiments and examples described herein allow a thermal energy harvester that produces a thermal capacitor from ambient air.

Additionally, and among other benefits, illustrative embodiments and examples described herein allow harvesting of thermal energy on Mars that is aided rather than hampered by dust storm winds.

Additionally, and among other benefits, illustrative embodiments and examples described herein allow an energy harvester that is deployable without on-site setup.

No known system or device can perform these functions, particularly on a remote planet. Thus, the illustrative embodiments and examples described herein are particularly useful for supplying electrical power on Mars. However, not all embodiments and examples described herein provide the same advantages or the same degree of advantage.

Conclusion

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. An energy harvesting apparatus, comprising:
a thermoelectric device,
a heat exchanger coupled to the thermoelectric device,
a thermal capacitor generation device including:
  a reservoir containing a first chemical constituent,
  an extraction module configured to extract a second chemical constituent and a third chemical constituent from an ambient atmosphere,
  a first chemical production module configured to produce a solvent by reacting the first chemical constituent and the second chemical constituent, and
  a second chemical production module configured to produce a solute by reacting the first chemical constituent and the third chemical constituent,
wherein the thermal capacitor generation device is configured to synthesize a thermal capacitor fluid by dissolving the solute in the solvent, a thermal capacitor container for storing the thermal capacitor fluid synthesized by the thermal capacitor generation device, and a first electrical energy storage device electrically connected to the thermoelectric device for storing electricity generated by the thermoelectric device.

2. The energy harvesting apparatus of claim 1, wherein the thermal capacitor generation device is configured to synthesize water.

3. The energy harvesting apparatus of claim 1, wherein the thermal capacitor generation device is configured to synthesize an aqueous ammonia solution tuned to change phase at a selected intermediate temperature of a selected environment.

4. The energy harvesting apparatus of claim 3, wherein the thermal capacitor generation device is configured to alter the concentration of ammonia in the aqueous ammonia solution to adjust the melting temperature of the thermal capacitor fluid in response to a change in an ambient temperature range.

5. The energy harvesting apparatus of claim 3, wherein the selected intermediate temperature is the average temperature at dawn in the selected environment.

6. The energy harvesting apparatus of claim 3, wherein the selected environment is on Mars.

7. The energy harvesting apparatus of claim 1, further comprising a solar energy harvesting device electrically connected to the first electrical energy storage device.

8. The energy harvesting apparatus of claim 7, wherein the solar energy harvesting device is configured to supply electricity to the thermal capacitor generation device for the purpose of synthesizing the thermal capacitor fluid.

9. The energy harvesting apparatus of claim 1, wherein the heat exchanger transfers energy between an ambient environment and the stored thermal capacitor fluid.

10. The energy harvesting apparatus of claim 1, wherein the stored thermal capacitor fluid stores energy using a liquid-to-solid phase change, and wherein the phase change is tuned to occur at a selected intermediate temperature of a selected environment.

11. The energy harvesting apparatus of claim 1, wherein the first chemical constituent is hydrogen.

12. The energy harvesting apparatus of claim 11, wherein the thermal capacitor generation device includes a processor configured to control synthesis of an aqueous ammonia solution.

13. The energy harvesting apparatus of claim 1, wherein the heat exchanger is positioned adjacent a first side of the thermoelectric device, and the thermal capacitor container is positioned adjacent a second side of the thermoelectric device, the first side of the thermoelectric device being opposite from the second side.

14. The energy harvesting apparatus of claim 1, wherein the extraction module is configured to extract oxygen and nitrogen from the ambient air, and to extract the oxygen by disassociation of carbon dioxide.

15. The energy harvesting apparatus of claim 1, wherein the first chemical constituent is transported from Earth to a remote planet.

16. The energy harvesting apparatus of claim 1, wherein the first chemical constituent is Hydrogen, the second chemical constituent is Oxygen, the third chemical constituent is Nitrogen, the solvent is water, the solute is ammonia, and the thermal capacitor fluid is an aqueous ammonia solution.

17. The energy harvesting apparatus of claim 1, wherein the thermal capacitor generation device further includes a tuning control configured to regulate the concentration of the solute dissolved in the solvent, such that the synthesized thermal capacitor fluid has a liquid to solid phase transition at a temperature within a periodic temperature fluctuation range of the ambient atmosphere.

18. A method of harvesting energy comprising:

storing hydrogen in a reservoir of an energy harvesting apparatus, wherein the energy harvesting apparatus includes a thermoelectric device and a heat exchanger coupled to the thermoelectric device, synthesizing a thermal capacitor fluid comprising an aqueous ammonia solution using a thermal capacitor generation device, by:

reacting oxygen extracted from the ambient air with the stored hydrogen in a first chemical production module to produce water, reacting nitrogen extracted from the ambient air with the stored hydrogen in a second chemical production module to produce ammonia, dissolving the ammonia in the water to produce the aqueous ammonia solution, and storing the aqueous ammonia solution in a thermal capacitor container adjacent the thermoelectric device, generating electrical energy using ambient environmental atmosphere and the thermal capacitor fluid in thermal communication with the thermoelectric device, and storing electrical energy generated in the generating step in a second energy storage device.

19. The method of claim 18, further comprising:

tuning the aqueous ammonia solution to change phase at a selected intermediate temperature of a selected environment.

20. The method of claim 19, further comprising:

altering the aqueous ammonia solution to adjust the melting temperature of the aqueous ammonia solution in response to a change in an ambient temperature range.

21. The method of claim 19, wherein the selected environment is on Mars.

22. An energy harvesting apparatus comprising, a thermoelectric device, a synthesis module including:

a reservoir containing hydrogen, an extraction module configured to extract oxygen and nitrogen from the ambient atmosphere, a first chemical production module configured to produce water by reacting the hydrogen and the oxygen, and a second chemical production module configured to produce ammonia by reacting the hydrogen and the nitrogen, wherein the synthesis module is configured to synthesize a thermal capacitor fluid comprising an aqueous ammonia solution by dissolving the ammonia in the water, and wherein the synthesis module includes a controller configured to alter the ammonia concentration of the aqueous ammonia solution, and a thermal capacitor container for storing the aqueous ammonia solution, adjacent the thermoelectric device such that the aqueous ammonia solution contained in the thermal capacitor container is in thermal communication with the thermoelectric device, wherein the aqueous ammonia solution has a liquid to solid phase transition at a temperature within a periodic temperature fluctuation range of the ambient atmosphere.

23. The energy harvesting apparatus of claim 22, wherein the controller is configured to alter the ammonia concentration in the aqueous ammonia solution in response to a change in the periodic temperature fluctuation range of the ambient atmosphere.

24. The energy harvesting apparatus of claim 23, wherein the controller is configured to alter the aqueous ammonia solution to change phase at a selected intermediate temperature of the periodic temperature fluctuation range.

* * * * *